(12) United States Patent
Lee (10) Patent No.: US 9,356,000 B2
(45) Date of Patent: May 31, 2016

(54) SEMICONDUCTOR INTEGRATED CIRCUIT AND SEMICONDUCTOR SYSTEM WITH THE SAME

(71) Applicant: SK hynix Inc., Gyeonggi-do (KR)

(72) Inventor: Tae-Yong Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 315 days.

(21) Appl. No.: 13/841,541

(22) Filed: Mar. 15, 2013

(65) Prior Publication Data

US 2014/0175667 A1 Jun. 26, 2014

(30) Foreign Application Priority Data

Dec. 20, 2012 (KR) .......................... 10-2012-0150025

(51) Int. Cl.
*H01L 25/00* (2006.01)
*H01L 23/52* (2006.01)
*H01L 25/065* (2006.01)
*H01L 23/48* (2006.01)

(52) U.S. Cl.
CPC .......... *H01L 25/0657* (2013.01); *H01L 23/481* (2013.01); *H01L 2224/16145* (2013.01); *H01L 2225/06513* (2013.01); *H01L 2225/06541* (2013.01); *H01L 2225/06565* (2013.01)

(58) Field of Classification Search
CPC .......................... H01L 25/0657; H01L 23/481
See application file for complete search history.

(56) References Cited

U.S. PATENT DOCUMENTS

| | | | | |
|---|---|---|---|---|
| 2002/0109236 | A1* | 8/2002 | Kim ...................... | H01L 23/481 257/777 |
| 2005/0082664 | A1* | 4/2005 | Funaba ................. | H01L 23/544 257/724 |
| 2011/0079924 | A1* | 4/2011 | Suh .......................... | G11C 5/00 257/777 |
| 2011/0110064 | A1* | 5/2011 | Foster, Sr. ............. | H01L 23/481 361/803 |
| 2011/0291265 | A1* | 12/2011 | Jin ........................ | H01L 23/481 257/737 |
| 2012/0319757 | A1* | 12/2012 | Sato .................... | H01L 25/0657 327/419 |
| 2013/0106463 | A1* | 5/2013 | Chi ..................... | H01L 25/0657 326/39 |

FOREIGN PATENT DOCUMENTS

KR 1020130042078 4/2013

* cited by examiner

*Primary Examiner* — Marvin Payen
*Assistant Examiner* — Jeremy Joy
(74) *Attorney, Agent, or Firm* — IP & T Group LLP (57) ABSTRACT

A semiconductor integrated circuit may include a plurality of semiconductor chips configured to be stacked in three dimensions, a first group of through-chip vias configured to go through the plurality of semiconductor chips, respectively, and to be used for density extension of the semiconductor integrated circuit, and a second group of through-chip vias configured to go through the plurality of semiconductor chips, respectively, and to be used for a bandwidth extension of the semiconductor integrated circuit. Each of the plurality of semiconductor chips includes a path selection unit configured to select one of the first group of through-chip vias arranged in the semiconductor chip or one of the second group of through-chip vias arranged in the semiconductor chip in response to a mode switching signal, and an internal circuit configured to be selectively coupled to a through-chip via selected by the path selection unit.

11 Claims, 6 Drawing Sheets

SEMICONDUCTOR INTEGRATED CIRCUIT AND SEMICONDUCTOR SYSTEM WITH THE SAME

CROSS-REFERENCE TO RELATED APPLICATIONS

The present application claims priority of Korean Patent Application No. 10-2012-0150025, filed on Dec. 20, 2012, which is incorporated herein by reference in its entirety.

BACKGROUND

1. Field

Exemplary embodiments of the present invention relate to a semiconductor designing technology, and more particularly, to a semiconductor integrated circuit having a stacked package structure and a semiconductor system with the same.

2. Description of the Related Art

In general, packaging technologies for semiconductor integrated circuits have continuously been advanced to meet demand for miniaturization and packaging reliability. Various technologies for stacked packages have recently been developed to meet demand for not only miniaturization but also high performance of electric/electronic products.

"Stacking" in the field of semiconductor device means piling at least two semiconductor chips or packages to be arranged in three dimensions. For example, the stacked package allows the semiconductor memory devices may to have a memory density per unit area that is twice or more than two dimensionally packaged memory devices without change of semiconductor integration processes. Advantages of the stacked package such as the density and size efficiency have triggered studies and developments of the stacked packages.

There are two types of stacked packages. First type is individual semiconductor chips to be packaged after stacking, and second type is one of individually packaged semiconductor chips. The individual semiconductor chips of the stacked package are coupled via metal wires, through-chip vias, or the like. In particular, the stacked package using a through-chip via, which will be noted as a through-silicon via (TSV) in the Figures and the specification, has a configuration in which the through-chip vias are formed in each of the semiconductor chips to couple the three-dimensionally stacked semiconductor chips physically and electrically.

Figure 1:
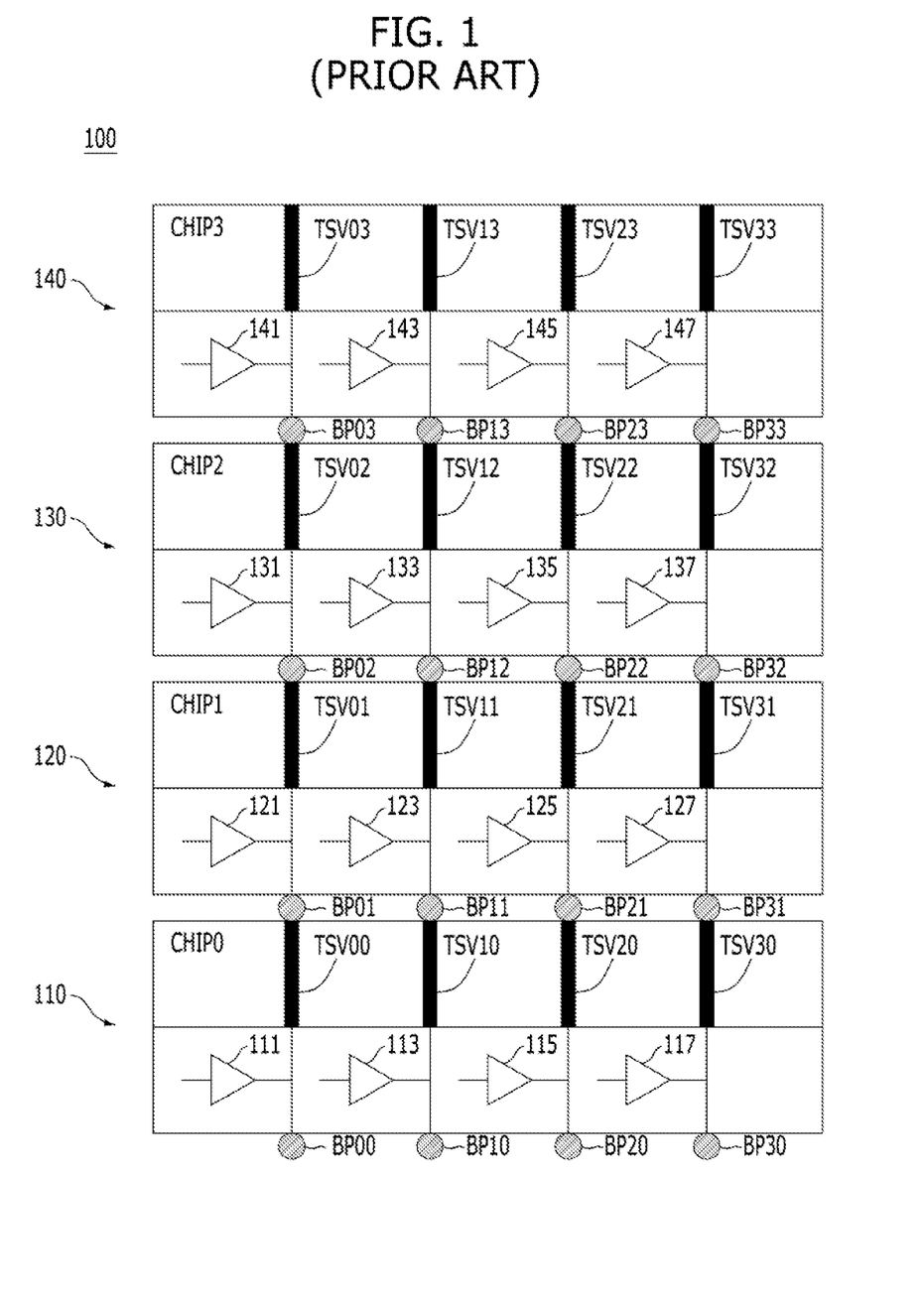
FIG. 1 is an exemplary diagram illustrating the configuration of a semiconductor integrated circuit according to a related art.

FIG. 1 is an exemplary diagram illustrating the configuration of a semiconductor integrated circuit according to a related art.

Referring to FIG. 1, the semiconductor integrated circuit 100 includes first to fourth semiconductor chips 110 to 140 configured to be vertically stacked, first to fourth groups of through-chip vias TSV00 to TSV03, TSV10 to TSV13, TSV20 to TSV23, and TSV30 to TSV33 configured to vertically penetrate the first to fourth semiconductor chips 110 to 140 respectively, first to fourth groups of bump pads BP00 to BP03, BP10 to BP13, BP20 to BP23, and BP30 to BP33 configured to be provided in lower portions of the first to the fourth semiconductor chips 110 to 140 and to couple the first to fourth groups of through-chip vias TSV00 to TSV03, TSV10 to TSV13, TSV20 to TSV23, and TSV30 to TSV33 between the first to fourth semiconductor chips 110 to 140. The first to fourth semiconductor chips 110 to 140 include first to fourth groups of internal circuits 111 to 117, 121 to 127, 131 to 137, and 141 to 147 coupled to each of the first to fourth groups of through-chip vias TSV00 to TSV03, TSV10 to TSV13, TSV20 to TSV23, and TSV30 to TSV33, respectively.

Here, through-chip vias in each group of through-chip vias TSV00 to TSV03, TSV10 to TSV13, TSV20 to TSV23, or TSV30 to TSV33 are configured to be aligned in line and to be vertically coupled to each other between the first to fourth semiconductor chips 110 to 140. That is, the through-chip vias of the first group TSV00 to TSV03 are vertically coupled, the through-chip vias of the second group TSV10 to TSV13 are vertically coupled, the through-chip vias of the third group TSV20 to TSV23 are vertically coupled, and the through-chip vias of the fourth group TSV30 to TSV33 are vertically coupled.

The first to fourth internal circuits 111 to 117, 121 to 127, 131 to 137, and 141 to 147 may include input/output circuits.

The semiconductor integrated circuit 100 having the above-described configuration has the advantage that a total memory density increases, as the number of stacked semiconductor chips increases.

In the semiconductor integrated circuit 100 having the above-described configuration, however, through-chip vias in each group TSV00 to TSV03, TSV10 to TSV13, TSV20 to TSV23, or TSV30 to TSV33 share a common coupling node. Therefore, it is impossible to read the first to fourth semiconductor chips 110 to 140 simultaneously. Accordingly, it is impossible to increase bandwidth of the semiconductor integrated circuit with fixed number of through-chip vias regardless of increase of the number of stacked semiconductor chips. Increasing the number of through-chip vias for wider bandwidth of the semiconductor integrated circuit leads more space for the internal circuits for the increased number of through-chip vias, thereby increasing a size of the semiconductor chip.

Figure 2:
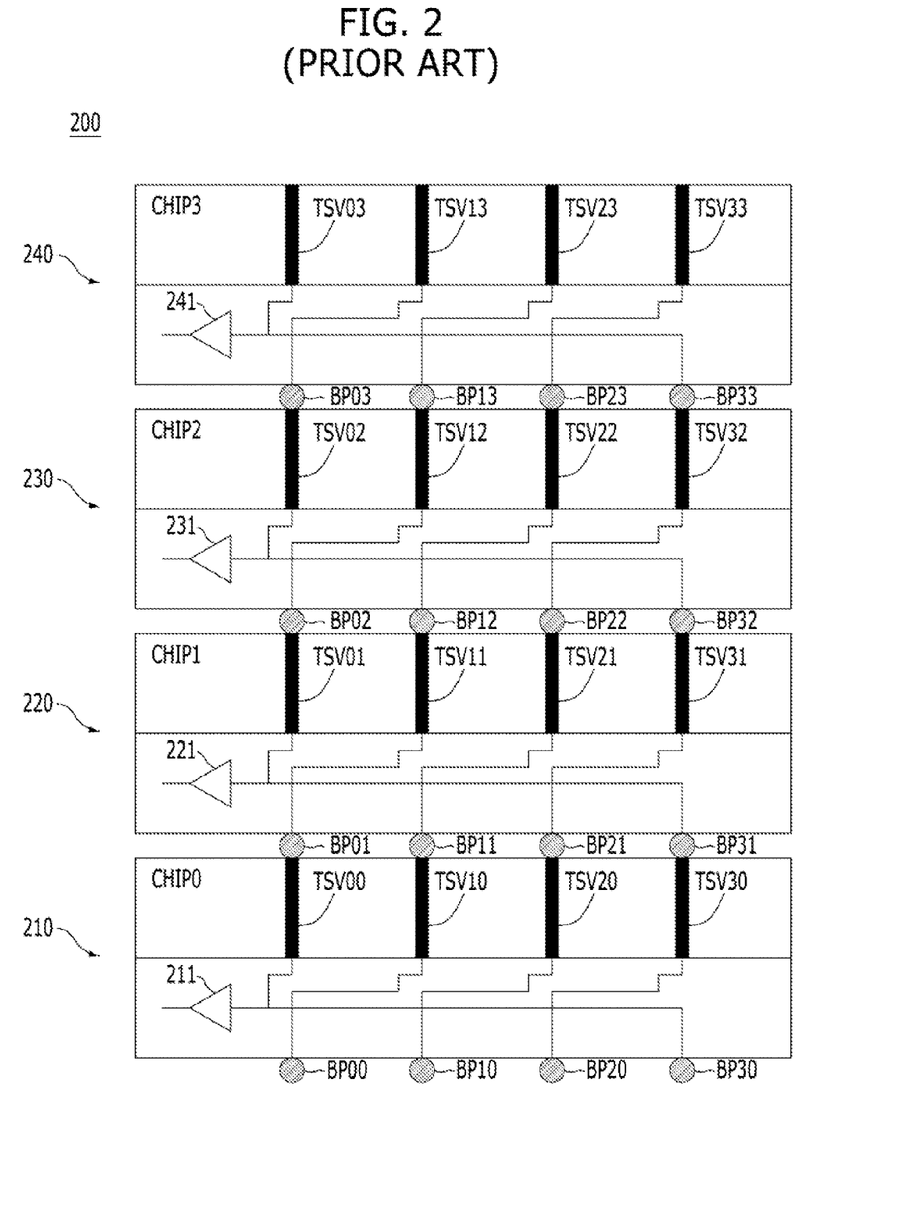
FIG. 2 is an exemplary diagram illustrating the configuration of a semiconductor integrated circuit according to another related art.

FIG. 2 is an exemplary diagram illustrating the configuration of a semiconductor integrated circuit according to another related art.

Referring to FIG. 2, the semiconductor integrated circuit 200 includes first to fourth semiconductor chips 210 to 240 configured to be vertically stacked, first to fourth groups of through-chip vias TSV00 to TSV03, TSV10 to TSV13, TSV20 to TSV23, and TSV30 to TSV33 configured to vertically penetrate the first to fourth semiconductor chips 210 to 240, respectively, first to fourth groups of bump pads BP00 to BP03, BP10 to BP13, BP20 to BP23, and BP30 to BP33 configured to be provided in lower portions of the first to the fourth semiconductor chips 210 to 240 and to couple the first to fourth groups of through-chip vias TSV00 to TSV03, TSV10 to TSV13, TSV20 to TSV23, and TSV30 to TSV33 between the first to fourth semiconductor chips 210 to 240. The first to fourth semiconductor chips 210 to 240 include internal circuits 211, 221, 231, and 241 coupled to at least one of the first to fourth groups of through-chip vias TSV00 to TSV03, TSV10 to TSV13, TSV20 to TSV23, and TSV30 to TSV33, respectively.

Here, through-chip vias in each group of the first to fourth groups of through-chip vias TSV00 to TSV03, TSV10 to TSV13, TSV20 to TSV23, and TSV30 to TSV33 are configured to be aligned in line and to be coupled to through-chip vias in another group across the semiconductor chip. That is, the through-chip vias of the first group TSV00 to TSV02, except for the through-chip via TSV03 of the uppermost semiconductor chip 240, are coupled to the through-chip vias of the second group TSV11 to TSV13 of the above-stacked semiconductor chip, respectively. The through-chip vias of the second group TSV10 to TSV12, except for the through-chip via TSV13 of the uppermost semiconductor chip 240, are coupled to the through-chip vias of the third group TSV21 to TSV23 of the above-stacked semiconductor chip, respectively. The through-chip vias of the third group TSV20 to TSV22, except for the through-chip via TSV23 of the uppermost semiconductor chip 240, are coupled to the through-chip vias of the fourth group TSV31 to TSV33 of the above-stacked semiconductor chip, respectively. The through-chip vias of the fourth group TSV30 to TSV32, except for the through-chip via TSV33 of the uppermost semiconductor chip 240, are coupled to the through-chip vias of the first group TSV00 to TSV02 of the above-stacked semiconductor chip, respectively.

The internal circuits 211, 221, 231, and 241 may include input/output circuits.

The semiconductor integrated circuit 200 having the above-described configuration has the advantages in that the number of internal circuits 211, 221, 231, and 241 respectively included in the semiconductor chips may be minimized, and it is possible to simultaneously input to and output from the first to fourth semiconductor chips 210 to 240, and thus to widen the bandwidth of the semiconductor integrated circuit with fixed number of through-chip vias.

In the semiconductor integrated circuit 200 having the above-described configuration, however, it is only one semiconductor chip that is coupled per through-chip via, which limits increase of the memory density per through-chip via. In other words, only one through-chip via is involved in data input and output in one semiconductor chip. Therefore, it may be impossible to increase the memory density per through-chip via with fixed number of through-chip vias regardless of increase of the number of stacked semiconductor chips.

SUMMARY

Various exemplary embodiments are directed to a semiconductor integrated circuit that may switch between interfaces for density extension and bandwidth extension, as necessary, and a semiconductor system including the semiconductor integrated circuit.

In an embodiment, a semiconductor integrated circuit may include a plurality of semiconductor chips configured to be stacked in three dimensions, a first group of through-chip vias configured to go through the plurality of semiconductor chips, respectively, and to be used for density extension of the semiconductor integrated circuit and a second group of through-chip vias configured to go through the plurality of semiconductor chips, respectively, and to be used for a bandwidth extension of the semiconductor integrated circuit. Each of the plurality of semiconductor chips includes a path selection unit configured to select one of the first group of through-chip vias arranged in the semiconductor chip or one of the second group of through-chip vias arranged in the semiconductor chip in response to a mode switching signal, and an internal circuit configured to be selectively coupled to a through-chip via selected by the path selection unit.

In another exemplary embodiment, a semiconductor integrated circuit may include N (where N is a natural number equal to or greater than 2) semiconductor chips configured to be stacked in three dimensions, and N groups of through-chip vias, each group of which is configured to go through the N semiconductor chips. The N groups of through-chip vias include a first group of through-chip vias, each through-chip via of which is coupled to one another between the N semiconductor chips, and a second group of through-chip vias, each through-chip via of which is coupled to one another together with the first group of through-chip vias between the N semiconductor chips.

In still another embodiment, a semiconductor integrated circuit may include a plurality of semiconductor chips configured to be stacked in three dimensions, a first group of through-chip vias configured to go through the plurality of semiconductor chips, respectively, and to provide the plurality of semiconductor chips with a common connection, and a plurality of groups of through-chip vias, each group of which is configured to go through the plurality of semiconductor chips, respectively, and one through-chip via of each group of which is configured to be coupled to each of a plurality of internal circuits in a one-to-one manner. Each of the plurality of semiconductor chips includes a path selection unit configured to select one of the first group of through-chip vias arranged in the semiconductor chip or a through-chip via of the plurality of groups of through-chip vias arranged in the semiconductor chip in response to a mode switching signal, and the internal circuit configured to be selectively coupled to a through-chip via selected by the path selection unit.

In still another embodiment, a semiconductor system may include a controller, and a semiconductor integrated circuit configured to include a plurality of semiconductor chips communicating with the controller through a plurality of pads, at least one of the pads being coupled to the semiconductor chips in common while the rest of the pads are coupled to the semiconductor chips in an one-to-one manner, or all of the pads are coupled to the semiconductor chips in an one-to-one manner. The semiconductor integrated circuit transmits and receives the signal to and from the controller via at least one of the pads for a density extension of the semiconductor integrated circuit while the semiconductor integrated circuit transmits and receives the signal to and from the controller via the rest of the pads for a bandwidth extension of the semiconductor integrated circuit, or the semiconductor integrated circuit transmits and receives the signal to and from the controller via all of the pads for the bandwidth extension of the semiconductor integrated circuit.

DETAILED DESCRIPTION

Various exemplary embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 3:
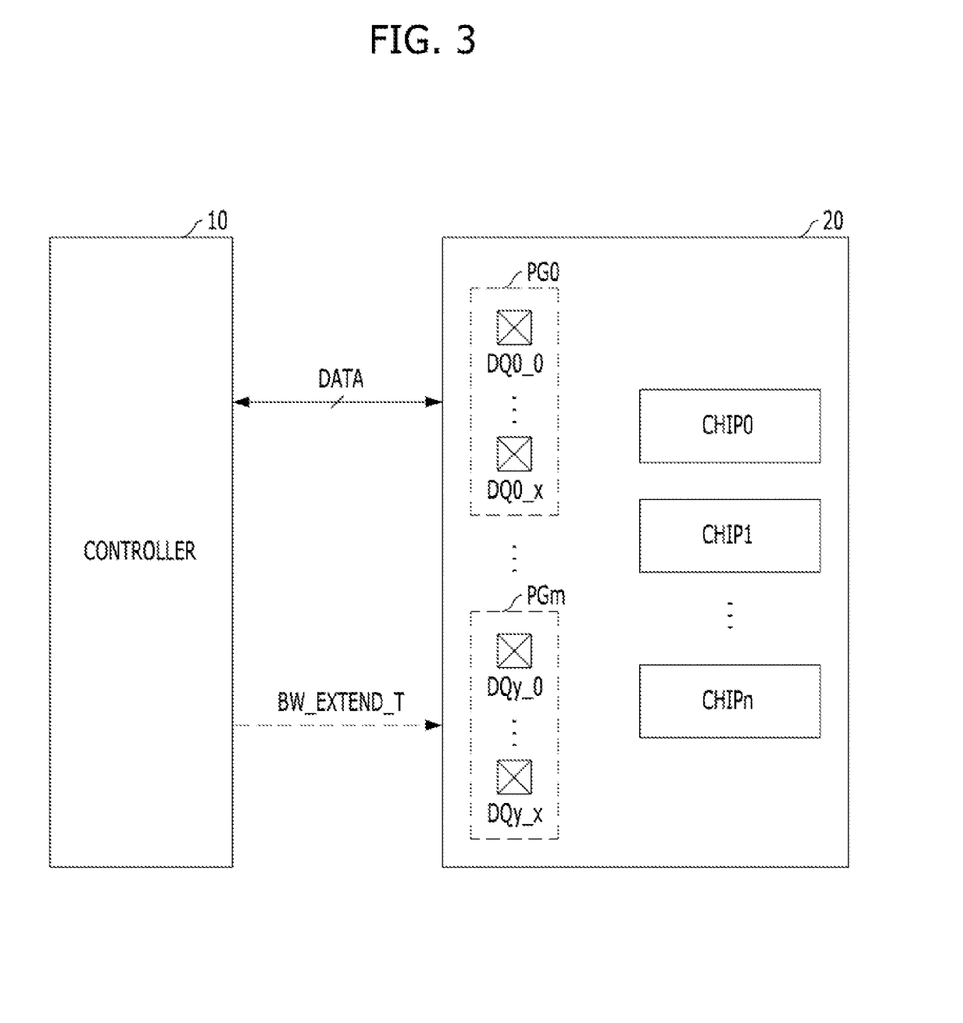
FIG. 3 is a block diagram illustrating the configuration of a semiconductor system according to an embodiment of the present invention.

FIG. 3 is a block diagram illustrating a semiconductor system according to an embodiment of the present invention.

Referring to FIG. 3, the semiconductor system includes a controller 10 and a semiconductor integrated circuit 20 having a plurality of pad groups PG0 to PGm respectively including a plurality of pads DQ0_0 to DQ0_x, . . . , and DQy_0 to DQy_x communicating between the controller 10 and a plurality of semiconductor chips CHIP0 to CHIPn. a Part of the plurality of pads DQ0_0 to DQ0_x, and DQy_0 to DQy_x may be coupled to the plurality of semiconductor chips CHIP0 to CHIPn in common, and rest or all of the plurality of pads DQ0_0 to DQ0_x, . . . , and DQy_0 to DQy_x may be coupled to the plurality of semiconductor chips CHIP0 to CHIPn in a one-to-one manner.

Here, one of the plurality of pads DQ0_0 to DQ0_x, and DQy_0 to DQy_x is involved with the semiconductor integrated circuit 20 for the density extension, and rest or all of the plurality of pads DQ0_0 to DQ0 x, . . . , and DQy_0 to DQy_x are involved with the semiconductor integrated circuit 20 for the bandwidth extension. The density extension and the bandwidth extension of the semiconductor integrated circuit 20 may be controlled by the controller 10 or under the control of a circuit included in the semiconductor integrated circuit 20 using a mode switching signal BW_EXTEND_T.

Hereinafter, the detailed configuration of the semiconductor integrated circuit 20 will be described with reference to FIGS. 4 to 6. The semiconductor integrated circuit 20 will be described according to first and second embodiments of the present invention. To facilitate and simplify the description, the reference numeral of the semiconductor integrated circuit 20 according to the first embodiment is denoted by '300' and the reference numeral of the semiconductor integrated circuit 20 according to the second embodiment is denoted by '400.' In the exemplary embodiments of the present invention, a structure in which four semiconductor chips are stacked will be described as an example, and the configuration corresponding to one pad group PG0 will be illustrated for the description.

Figure 4:
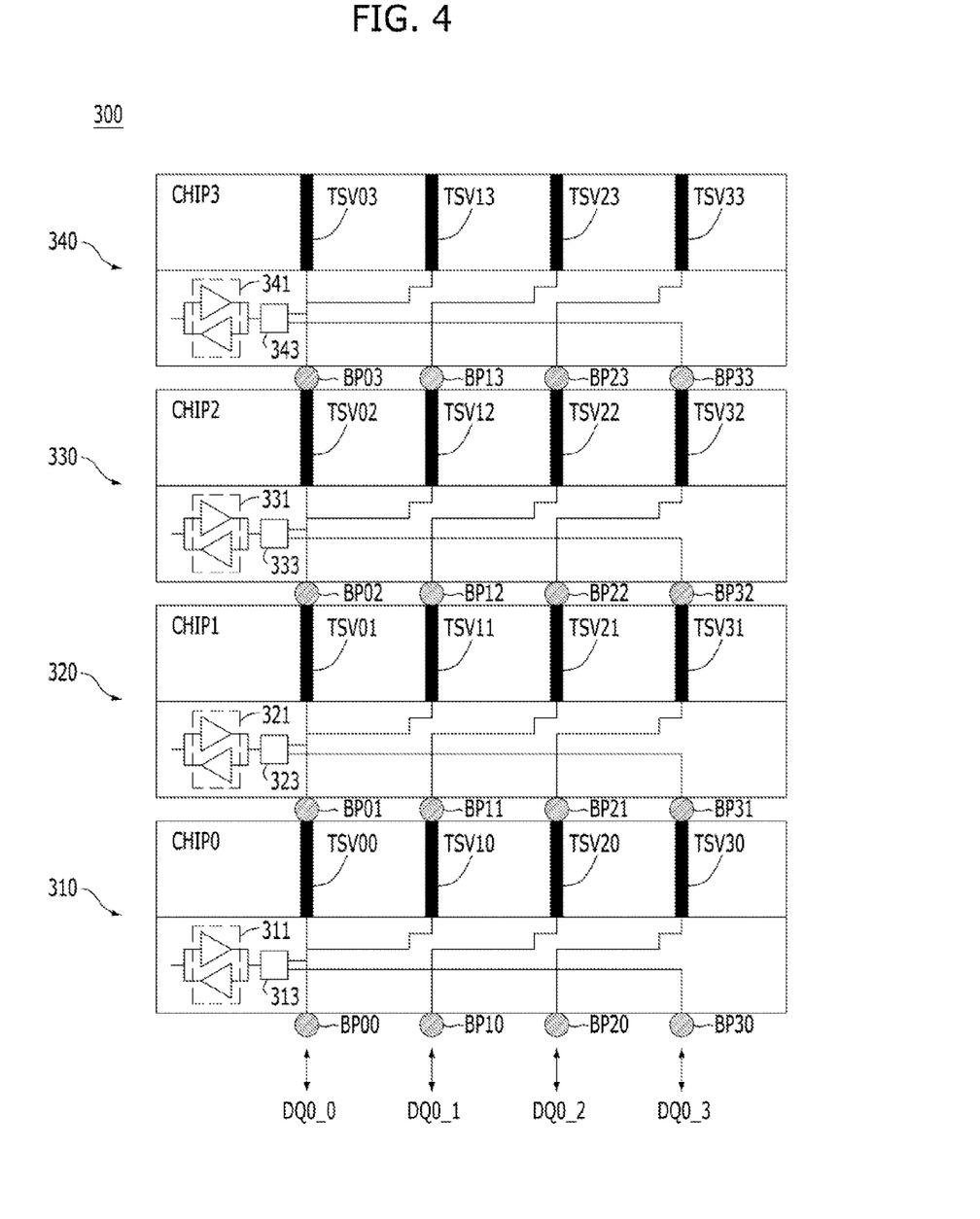
FIG. 4 is an exemplified diagram illustrating a semiconductor integrated circuit illustrated in FIG. 3 according to the first embodiment of the present invention.

FIG. 4 is an exemplary diagram illustrating the configuration of the semiconductor integrated circuit 20 according to the first embodiment of the present invention. FIG. 5 is a diagram illustrating an internal configuration of a path selection unit illustrated in FIG. 4.

Referring to FIG. 4, the semiconductor integrated circuit 300 according to the first embodiment of the present invention includes first to fourth semiconductor chips 310 to 340 configured to be stacked in three dimensions, first group of through-chip vias TSV00 to TSV03, each through-chip via of that is configured to go through the first to the fourth semiconductor chips 310 to 340, respectively, and are used for both of the density extension and the bandwidth extension, second to fourth groups of through-chip vias TSV10 to TSV13, TSV20 to TSV23, and TSV30 to TSV33, each through-chip via of which is configured to go through the first to the fourth semiconductor chips 310 to 340, respectively, and are used for the bandwidth extension, and first to fourth groups of bump pads BP00 to BP03, BP10 to BP13, BP20 to BP23, and BP30 to BP33 configured to be provided in lower portions of the first to fourth semiconductor chips 310 to 340 and couple the first to fourth groups of through-chip vias TSV00 to TSV03, TSV10 to TSV13, TSV20 to TSV23, and TSV30 to TSV33 to each other between the first to fourth semiconductor chips 310 to 340. The first to the fourth semiconductor chips 310 to 340 respectively include path selection units 313 to 343 that select one among the first group of through-chip vias TSV00 to TSV03 and one among the second to fourth groups of through-chip vias TSV10 to TSV13, TSV20 to TSV23, and TSV30 to TSV33, in response to mode switching signals BW_EXTEND_T and BW_EXTEND_B, and internal circuits 311 to 341 that are selectively coupled to the first group of through-chip vias TSV00 to TSV03 or one of the second to fourth groups of through-chip vias TSV10 to TSV13, TSV20 to TSV23, and TSV30 to TSV33 by the path selection units 313 to 343.

Here, through-chip vias in the first group TSV00 to TSV03 are configured to be substantially aligned through the semiconductor chips 310 to 340. The through-chip vias of the first group TSV00 to TSV03 may be coupled to each other between the semiconductor chips 310 to 340 through the first group of bump pads BP00 to BP03 and function as an interface for the density extension of the semiconductor integrated circuit 20, when coupled to the internal circuits 311 to 341 by the path selection units 313 to 343. Meanwhile, the through-chip vias of the first group TSV00 to TSV03 may also be coupled to the one of the second group of through-chip vias TSV10 to TSV13 between the semiconductor chips 310 to 340, respectively to co-function with the second to fourth groups of through-chip vias TSV10 to TSV13, TSV20 to TSV23, and TSV30 to TSV33 as an interface for the bandwidth extension of the semiconductor integrated circuit 20.

The through-chip vias in each group of the second to fourth groups TSV10 to TSV13, TSV20 to TSV23, and TSV30 to TSV33 are configured to be substantially aligned through the semiconductor chips 310 to 340 and to be coupled to one of another group between the semiconductor chips 310 to 340. That is, the through-chip vias of the second group TSV10 to TSV12 of the lower semiconductor chips 310 to 330 are coupled to one of the third group TSV21 to TSV23 of the upper semiconductor chips 320 to 340 via the second group of bump pads BP11 to BP13, respectively. The through-chip vias of the third group TSV20 to TSV22 of the lower semiconductor chips 310 to 330 are coupled to one of the fourth group TSV31 to TSV33 of the upper semiconductor chips 320 to 340 via the third group of bump pads BP21 to BP23, respectively. The through-chip vias of the fourth group TSV30 to TSV32 of the lower semiconductor chips 310 to 330 are coupled to the path selection units 323 to 343 of the upper semiconductor chips 320 to 340 via the fourth group of bump pads BP31 to BP33, respectively. The path selection unit 313 included in the first or lowermost semiconductor chip 310 is coupled to the lowermost one of the fourth group of bump pads BP30.

The internal circuits 311, 321, 331 and 341 may be configured to include input and output circuits. Since the input and output circuits are known technologies, the detailed description will be omitted.

Figure 5:
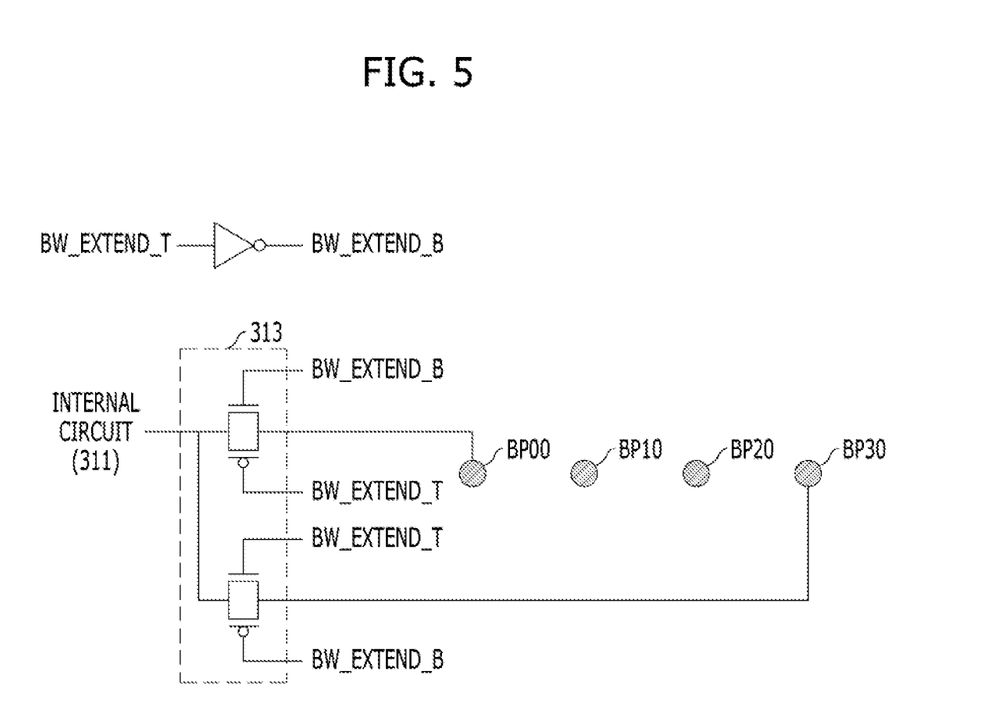
FIG. 5 is a diagram illustrating an internal configuration of a path selection unit illustrated in FIG. 4.

FIG. 5 is a diagram illustrating internal configurations of the path selection units 313, 323, 333 and 343 illustrated in FIG. 4. Since the path selection units 313, 323, 333 and 343 have substantially the same configuration, only the path selection unit 313 included in the first semiconductor chip 310 will be described below as an example.

Referring to FIG. 5, the path selection unit 313 of the first semiconductor chip 310 includes a first transmission gate that selectively couples a bump pad BP00 of the first group of bump pads BP00 to BP03 to the internal circuit 311 of the first semiconductor chip 310 in response to the mode switching signals BW_EXTEND_T and BW_EXTEND_B, and a second transmission gate that selectively couples a bump pad BP30 of the fourth group of bump pads BP30 to BP33 to the internal circuit 311 in response to the mode switching signals BW_EXTEND_T and BW_EXTEND_B.

Here, the mode switching signal BW_EXTEND_T may be a signal generated in one of the first to fourth semiconductor chips 310 to 340 or may be a signal input from the controller 10. In case where the mode switching signal BW_EXTEND_T is the signal generated in one of the first to fourth semiconductor chips 310 to 340, each of the first to fourth semiconductor chips 310 to 340 includes a mode switching signal generation circuit (not illustrated in the drawing) that generates the mode switching signals BW_EXTEND_T and BW_EXTEND_B. For example, the mode switching signal generation circuit may include a fuse circuit. In the case where the mode switching signal BW_EXTEND_T is a signal input from the controller 10, the semiconductor integrated circuit 300 includes a third group of through-chip vias (not illustrated in the drawing) for the mode switching signal BW_EXTEND_T. For example, the third group of through-chip vias is configured to go through the first to fourth semiconductor chips 310 to 340, respectively, to be coupled to one another between the first to fourth semiconductor chips 310 to 340, and to provide the first to fourth semiconductor chips 310 to 340 respectively with the mode switching signal BW_EXTEND_T.

Description for the embodiment of the present invention is set forth as an example in which four semiconductor chips are stacked, and therefore, four through-chip vias arranged in one semiconductor chip, each of which is one from each of the first to the fourth groups of through-chip vias TSV00 to TSV03, TSV10 to TSV13, TSV20 to TSV23, and TSV30 to TSV33, selectively co-function with one another as the interface for the density extension or the bandwidth extension of the semiconductor integrated circuit 20. However, the embodiment of the present invention may be expanded to the case where less than or more than four semiconductor chips are stacked. That is, a plurality of through-chip vias in one semiconductor chip, whose number is same as the number of stacked semiconductor chips, may selectively co-function with one another as the interface for the density extension or the bandwidth extension of the semiconductor integrated circuit. For example, when eight semiconductor chips are stacked, eight through-chip vias may be provided per semiconductor chip, first one of which may function as an interface for both of the density extension and the bandwidth extension, and rest of which may function as an interface for the bandwidth extension.

Hereinafter, an operation of the semiconductor integrated circuit 300 having the above-described configuration according to the first embodiment of the present invention will be described.

First, an operation for the density extension will be described.

The mode switching signals BW_EXTEND_T and BW_EXTEND_B are inactivated for the density extension, and the path selection units 313, 323, 333 and 343 couple the first group of bump pads BP00 to BP03 to the internal circuits 311, 321, 331 and 341, respectively.

Accordingly, the internal circuits 311, 321, 331 and 341 communicate with the controller 10 via the first group of through-chip vias TSV00 to TSV03.

In this case, since the first to fourth semiconductor chips 310, 320, 330 and 340 share one pad DQ0_0, the density is extended.

Next, an operation for the bandwidth extension will be described.

The mode switching signals BW_EXTEND_T and BW_EXTEND_B are activated for the bandwidth extension, and the path selection units 313, 323, 333 and 343 couple the fourth group of bump pads BP30 to BP33 to the internal circuits 311, 321, 331 and 341, respectively.

Accordingly, the internal circuits 311, 321, 331 and 341 communicate with the outside via the entire first to fourth groups of through-chip vias TSV00 to TSV03, TSV10 to TSV13, TSV20 to TSV23, and TSV30 to TSV33.

In this case, since the first to the fourth semiconductor chips 310, 320, 330 and 340 individually use four pads DQ0_0 to DQ0_3, the bandwidth is extended.

Thus, according to the first embodiment of the present invention, it is possible to achieve the effect of extending the density or the bandwidth as necessary by switching between interfaces for the density extension and the bandwidth extension.

Figure 6:
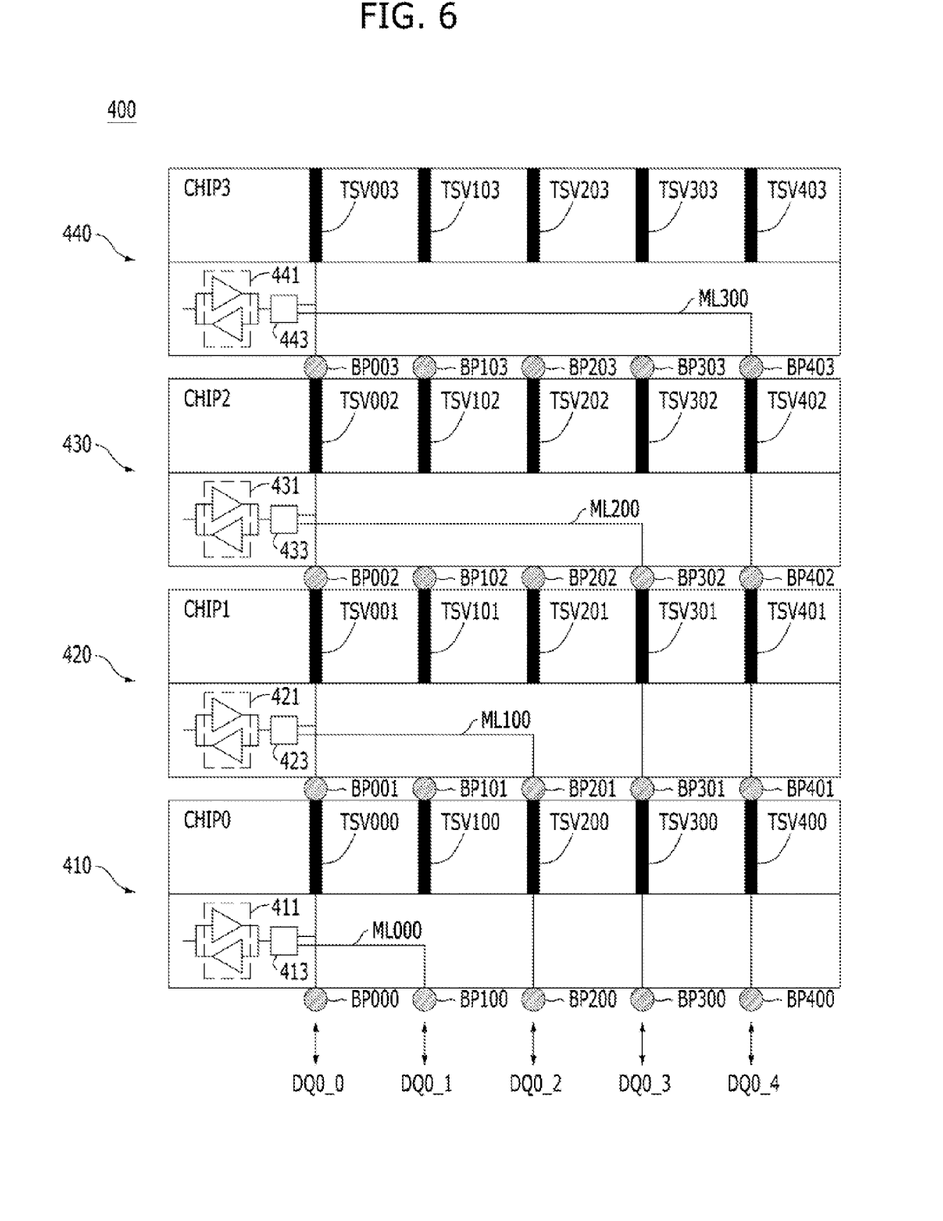
FIG. 6 is an exemplified diagram illustrating another example of the semiconductor integrated circuit illustrated in FIG. 3 according to the second embodiment of the present invention.

FIG. 6 is an exemplary diagram illustrating the configuration of a semiconductor integrated circuit 400 according to the second embodiment of the present invention.

The second embodiment of the present invention provides a technology for extending the density or the bandwidth, as necessary, as the first embodiment of the present invention. Accordingly, in the second embodiment of the present invention, only configurations different from those of the first embodiment of the present invention will be described.

Referring to FIG. 6, the semiconductor integrated circuit 400 according to the second embodiment of the present invention may include a first group of through-chip vias TSV000 to TSV003, each through-chip via of which goes through first to fourth semiconductor chips 410 to 440, respectively, and are commonly coupled to the first to fourth semiconductor chips 410 to 440, and second to fifth groups of through-chip vias TSV100 to TSV103, TSV200 to TSV203, TSV300 to TSV303, and TSV400 to TSV403, each through-chip via of each group of which goes through the first to fourth semiconductor chips 410 to 440, respectively, and one through-chip via of each group of which may be exclusively coupled to each of internal circuits 411, 421, 431 and 441 of the first to fourth semiconductor chips 410 to 440 in a one-to-one manner.

For example, one through-chip via TSV001 of the second group TSV100 to TSV103 may be coupled to the internal circuits 411 of the first semiconductor chip 410. One through-chip via TSV201 of the third group TSV200 to TSV203 may be coupled to the internal circuits 421 of the second semiconductor chip 420. One through-chip via TSV302 of the fourth group TSV300 to TSV303 may be coupled to the internal circuits 431 of the third semiconductor chip 430. One through-chip via TSV403 of the fifth group TSV400 to TSV403 may be coupled to the internal circuits 441 of the fourth semiconductor chip 440.

Conductive lines ML000, ML100, ML200 and ML300 couple the internal circuits 411, 421, 431 and 441 to the corresponding through-chip via of each group of the second to the fifth groups of through-chip vias TSV100 to TSV103, TSV200 to TSV203, TSV300 to TSV303, and TSV400 to TSV403, respectively, through the path selection units 413, 423, 433 and 443.

According to the second embodiment of the present invention, an effect of signal coupling noise of the conductive lines may be minimized, and an area for the conductive lines may also be minimized.

While the present invention has been described with respect to the specific embodiments, it should be noted that the embodiments are for describing, not limiting, the present invention. Further, it should be noted that the present invention may be achieved in various ways through substitution, change, and modification, by those skilled in the art without departing from the scope of the present invention.

For example, in the embodiments of the present invention, a face-down bumping type structure in which the first to fourth semiconductor chips are faced downward and then are stacked. However, the present invention is not limited thereto. The present invention may also be applied to a face-up bumping type structure in which the first to fourth semiconductor chips may be faced upward, and then are stacked.

Since a density extension structure and a bandwidth extension structure may be selectively used, it is possible to achieve the effect of flexible alternation depending on a condition necessary for a system.

What is claimed is:

1. A semiconductor integrated circuit comprising:
   a plurality of semiconductor chips configured to be stacked in three dimensions;
   a first group of through-chip vias configured to go through the plurality of semiconductor chips, respectively, and to be used for a density extension and a bandwidth extension of the semiconductor integrated circuit; and
   a second group of through-chip vias configured to go through the plurality of semiconductor chips, respectively, and to be used for the bandwidth extension of the semiconductor integrated circuit,
   wherein each of the plurality of semiconductor chips includes
   a path selection unit configured to select one of the first group of through-chip vias arranged in the semiconductor chip or one of the second group of through-chip vias arranged in the semiconductor chip in response to a mode switching signal activated for the density extension or the bandwidth extension, and
   an internal circuit configured to be selectively coupled to a through-chip via selected by the path selection unit.

2. The semiconductor integrated circuit of claim 1,
   wherein the first group of through-chip vias is substantially aligned through the plurality of semiconductor chips and is coupled to one another between the semiconductor chips, and
   wherein the second group of through-chip vias is substantially aligned through the plurality of semiconductor chips, and each through-chip via of the second group of through-chip vias arranged in one of the plurality of semiconductor chips is coupled to each other with the first group of through-chip vias arranged in another one of the plurality of semiconductor chips.

3. The semiconductor integrated circuit of claim 1, wherein the path selection unit includes
   a first coupling unit configured to couple the internal circuit to one of the first group of through-chip vias in response to the mode switching signal, and
   a second coupling unit configured to couple the internal circuit to one of the second group of through-chip vias in response to the mode switching signal.

4. The semiconductor integrated circuit of claim 1, wherein each of the plurality of semiconductor chips further includes a fuse circuit unit configured to generate the mode switching signal.

5. The semiconductor integrated circuit of claim 1, further comprising:
   a third group of through-chip vias configured to go through the plurality of semiconductor chips, respectively, to be coupled to one another between the semiconductor chips, and to provide the plurality of semiconductor chips respectively with the mode switching signal applied from the outside.

6. A semiconductor integrated circuit comprising:
   N (where N is a natural number equal to or greater than 2) semiconductor chips configured to be stacked in three dimensions; and
   N groups of through-chip vias, each group of which is configured to go through the N semiconductor chips,
   wherein the N groups of through-chip vias include
   one first group of through-chip vias configured to go through the plurality of semiconductor chips, respectively, and to be used for a density extension and a bandwidth extension of the semiconductor integrated circuit, and
   N−1 second group of through-chip vias configured to go through the N semiconductor chips, respectively, and to be used for a bandwidth extension of the N semiconductor integrated circuit.

7. The semiconductor integrated circuit according to claim 6, wherein through-chip vias of each group of through-chip vias is substantially aligned through the N semiconductor chips.

8. The semiconductor integrated circuit according to claim 6, wherein each of the N semiconductor chips includes
   a path selection unit configured to select one of the first group of through-chip vias arranged in the semiconductor chip or one of the second group of through-chip vias arranged in the semiconductor chip in response to a mode switching signal, and
   an input/output unit configured to be selectively coupled to a through-chip via selected by the path selection unit.

9. The semiconductor integrated circuit according to claim 8, wherein the path selection unit includes
   a first selection unit configured to selectively couple the input/output unit to one of the first group of through-chip vias in response to the mode switching signal, and
   a second selection unit configured to selectively couple the input/output unit to one of the second group of through-chip vias in response to the mode switching signal.

10. The semiconductor integrated circuit according to claim 6, wherein each of the N semiconductor chips further includes a fuse circuit unit configured to generate the mode switching signal.

11. The semiconductor integrated circuit according to claim 6, further comprising:
   a third group of through-chip vias configured to go through the N semiconductor chips, respectively, to be coupled to one another between the semiconductor chips, and to provide the N semiconductor chips respectively with the mode switching signal applied from the outside.

* * * * *